(12) United States Patent
Moriyama

(10) Patent No.: US 6,579,373 B2
(45) Date of Patent: Jun. 17, 2003

(54) SUBSTRATE PROCESSING APPARATUS AND SUBSTRATE PROCESSING METHOD

(75) Inventor: Hirofumi Moriyama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/271,551

(22) Filed: Oct. 17, 2002

(65) Prior Publication Data

US 2003/0077919 A1 Apr. 24, 2003

(30) Foreign Application Priority Data

Oct. 23, 2001 (JP) ......................................... 2001-324844

(51) Int. Cl.[7] ............................................... C23C 16/00

(52) U.S. Cl. ...................... 118/724; 118/725; 118/728; 438/795

(58) Field of Search ................................ 118/724, 725, 118/728; 438/758, 795

(56) References Cited

U.S. PATENT DOCUMENTS

| | | | | | |
|---|---|---|---|---|---|
| 6,072,162 A | * | 6/2000 | Ito et al. | .................. | 219/444.1 |
| 6,172,337 B1 | * | 1/2001 | Johnsgard et al. | .......... | 219/300 |
| 6,183,563 B1 | * | 2/2001 | Choi et al. | .................. | 118/715 |
| 6,319,322 B1 | * | 11/2001 | Ueda et al. | .................. | 118/666 |
| 6,342,691 B1 | * | 1/2002 | Johnsgard et al. | .......... | 219/390 |
| 6,354,832 B1 | * | 3/2002 | Yoshimura et al. | ......... | 432/247 |

* cited by examiner

Primary Examiner—Alexander Ghyka
(74) Attorney, Agent, or Firm—Rader, Fishman & Grauer PLLC

(57) ABSTRACT

A humidifying heat treating unit for heating a wafer W having a coated film such as a dielectric film formed thereon under a humidified atmosphere comprises a hot plate for heating the wafer W, a chamber having a plurality of blocks, and provided with a gas supply port for supplying a humidified gas into the chamber and an exhaust port exhausting the chamber for every block, and a control section for controlling the supply-exhaust of the humidified gas into and out of the chamber. The control section controls the supply-exhaust of the humidified gas for every block.

21 Claims, 9 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for forming a film such as an interlayer insulating film on a substrate such as a semiconductor wafer.

2. Description of the Related Art

In the manufacturing process of a semiconductor device, known as one of the methods for forming a dielectric film such as an interlayer insulating film on a semiconductor wafer is a method of spin-coating a semiconductor wafer with a coating liquid by using an SOD (spin on dielectric) system, followed by applying a physical treatment such as heating to the coated liquid.

In recent years, a material having a low dielectric constant is required as a material of the interlayer insulating film and, thus, various materials, i.e., so-called "low-k materials", are being developed. Some of these low-k materials are required to be subjected to a heat treatment with a gas containing a prescribed amount of a water vapor.

FIG. 1 is a cross sectional view schematically showing the construction of a conventional heat treating unit 101 used for forming a dielectric film by using a low-k material requiring a heat treatment under a humidified atmosphere. As shown in the drawing, the heat treating unit 101 comprises a hot plate 102 on which a wafer W is disposed and a chamber 103 housing the hot plate 102 and the wafer W disposed on the hot plate 102. The chamber 103 consists of a lower vessel 103b and a lid 103a that can be lifted. A gas containing a prescribed amount of a water vapor is supplied into the chamber 103 through a gas supply port 104b formed in the bottom portion of the lower vessel 103b, with the result that the wafer W is exposed to the gaseous atmosphere. The gas supplied into the chamber 103 is exhausted to the outside through an exhaust port 104a formed in substantially the center of the lid 103a. Incidentally, a reference numeral 105 shown in FIG. 1 denotes a lift pin for moving a substrate G in a vertical direction.

It should be noted that, if the conventional heat treating unit 101 outlined above is used for applying a heat treatment to the wafer W having a coated film formed thereon, a substantially concentric thickness distribution is generated in the formed coated film as shown in FIG. 2 showing the film thickness distribution. Clearly, it is difficult to form a film having a uniform thickness over the entire wafer W.

BRIEF SUMMARY OF THE INVENTION

An object of the present invention is to provide a substrate processing apparatus and a substrate processing method that permit forming a film having a uniform thickness over the entire substrate.

According to a first aspect of the present invention, there is provided a substrate processing apparatus, comprising:

holding means for holding a substrate substantially horizontal;

a chamber for applying a prescribed processing to the substrate held by said holding means;

a gas supply port formed through the upper wall of said chamber;

gas supply means for supplying a gas containing a prescribed vapor into said chamber through said gas supply port;

a diffusion plate arranged above the substrate held by said holding means within said chamber and having a plurality of gas spurting ports arranged at prescribed positions so as to permit the gas supplied into said chamber through said gas supply port to be supplied substantially uniformly onto the surface of said substrate; and exhaust means for exhausting the gas supplied into said chamber to the outside through a bottom portion of said chamber.

In the substrate processing apparatus according to the first aspect of the present invention, a gas containing a prescribed vapor is supplied substantially uniformly onto the substrate so as to maintain constant the atmosphere around the substrate. As a result, it is possible to diminish the nonuniformity in the thickness and the characteristics of the formed film over the entire region of the substrate so as to make it possible to obtain a high quality substrate.

According to a second aspect of the present invention, there is provided a substrate processing apparatus, comprising:

holding means for holding a substrate substantially horizontal;

a chamber for applying a prescribed processing to the substrate held by said holding means and having a plurality of blocks;

a gas supply port and a gas exhaust port arranged in said chamber for every block;

gas supply means for supplying a gas containing a prescribed vapor into said; chamber through said gas supply port;

gas exhausting means for exhausting said chamber through said gas exhaust port; and a gas supply-exhaust control mechanism for optionally controlling for every block the gas supply into said chamber through said gas supply port and the exhaust of said chamber through said gas exhaust port.

According to a third aspect of the present invention, there is provided a substrate processing method for applying a prescribed processing to a substrate held under a prescribed gaseous atmosphere, comprising:

the step of housing a substrate in a chamber having a plurality of blocks and provided with a gas supply port and a gas exhaust port mounted for every block; and the step of processing a substrate by optionally carrying out for every block a gas supply processing for supplying a gas containing a prescribed vapor into said chamber through said gas supply port and an exhaust processing within said chamber through said gas exhaust port.

In the substrate processing apparatus according to the second aspect of the present invention and in the substrate processing method according to the third aspect of the present invention, the supply-exhaust of a process gas into and out of the chamber housing the substrate can be carried out for every block. Therefore, it is possible to permit a part of the substrate to be exposed to the atmosphere differing from that of the other portion. As a result, it is possible to eliminate a partial thickness distribution so as to form a uniform film over the entire substrate. It follows that the present invention makes, it possible to maintain a high quality of the substrate so as to improve the reliability.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

DETAILED DESCRIPTION OF THE INVENTION

Some embodiments of the present invention will now be described in detail with reference to the accompanying drawings. In the following description, an SOD system equipped with a humidifying heat treating unit (HAC) used in forming a dielectric film such as an interlayer insulating film on a semiconductor wafer is taken up as an example of the substrate processing apparatus according to one embodiment of the present invention.

Figure 3:
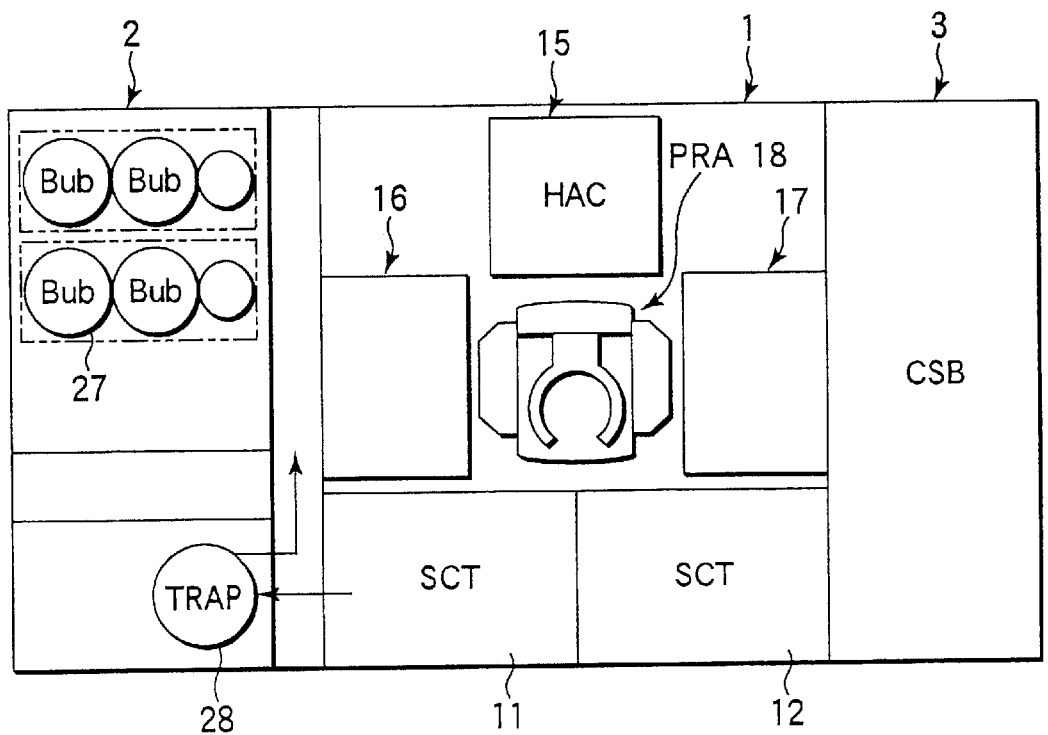
FIG. 3 is a plan view schematically showing the construction of an SOD system.
Figure 4:
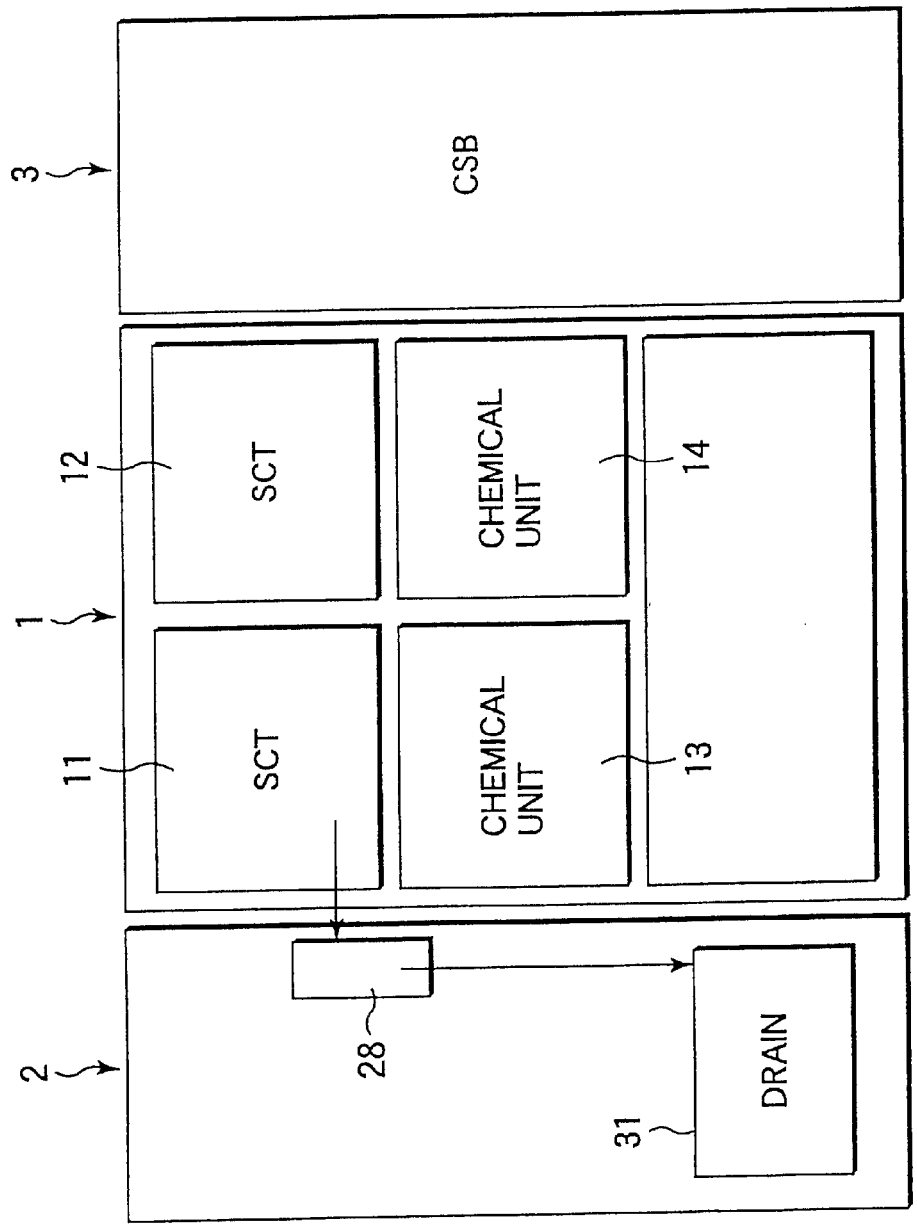
FIG. 4 is a side view of the SOD system shown in FIG. 3.

FIG. 3 is a plan view schematically showing the construction of the SOD system. FIG. 4 is a side view schematically showing the construction of the SOD system shown in FIG. 3. Further, FIG. 5 is another side view schematically showing the construction of the SOD system shown in FIG. 3.

As shown in the drawings, the SOD system includes a process section 1, a side cabinet 2, and a carrier station (CSB) 3. Coating process units (SCT) 11 and 12 are arranged in the upper portion on the front side (lower side in FIG. 3) of the process section 1, as shown in FIGS. 3 and 4.

Further, chemical units 13, 14 housing, for example, chemicals are arranged below the coating process units (SCT) 11, 12, respectively.

Figure 5:
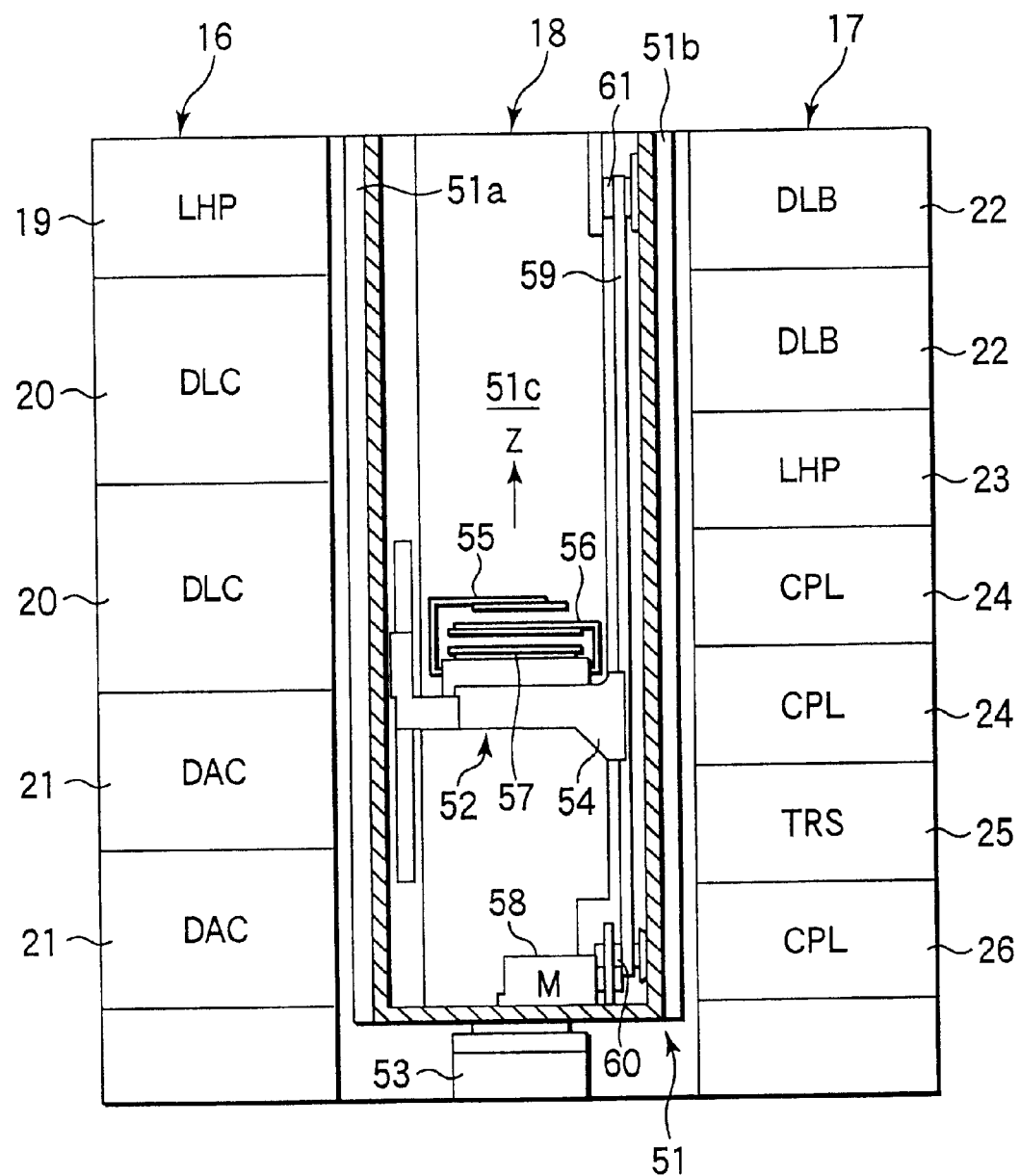
FIG. 5 is another side view of the SOD system shown in FIG. 3.

Process unit groups 16 and 17 each consisting of a plurality of process units that are stacked one upon the other are arranged in the central portion of the process section 1, as shown in FIGS. 3 and 5. Further, a wafer transfer mechanism (PRA) 18, which is moved in the vertical direction for transferring the wafer W, is arranged between the process unit group 16 and the process unit group 17. Further, a humidifying heat treating unit (HAC) capable of applying a heat treatment to the wafer W under a water vapor atmosphere is arranged behind the wafer transfer mechanism (PRA) 18. The construction of the humidifying heat treating unit (HAC) will be described herein later in detail.

The wafer transfer mechanism (PRA) includes a cylindrical support body 51 extending in the Z-direction and having vertical walls 51a, 51b and a side open portion 51c positioned between the vertical walls 51a and 51b. The wafer transfer mechanism (PRA) also includes a wafer transfer body 52 arranged inside the cylindrical support body 51 so as to be movable in the Z-direction along the cylindrical support body 51. The cylindrical support body 51 can be rotated by a motor 53. In accordance with rotation of the cylindrical support body 51, the wafer transfer body 52 is also rotated integrally.

The wafer transfer body 52 includes a transfer base 54 and three wafer transfer arms 55, 56, 57 movable back and forth along the transfer base 54. Each of the wafer transfer arms 55, 56, 57 is sized to be capable of passing through the side open portion 51c of the cylindrical support body 51. These wafer transfer arms 55, 56, 57 can be moved back and forth independently by a motor and a belt mechanism arranged within the transfer base 54. A belt 59 is driven by a motor 58 so as to move the wafer transfer body 52 in the vertical direction. Incidentally, a reference numeral 60 denotes a driving pulley, and a reference numeral 61 denotes a driven pulley.

As shown in FIG. 5, the process unit group 16 on the left side includes a hot plate unit (LHP) 19 for a low temperature, two curing, units (DLC) 20, and two aging units (DAC) 21, which are stacked one upon the other in the order mentioned as viewed from the upper side. On the other hand, the process unit group 17 on the right side includes baking units (DLB) 22, a hot plate unit (LHP) 23 for a low temperature, two cooling plate units (CPL) 24, a transfer unit (TRS) 25, and a cooling plate unit (CPL) 26, which are stacked one upon the other in the order mentioned as viewed from the upper side. Incidentally, it is possible for the transfer unit (TRS) to also perform the function of the cooling plate.

The side cabinet 2 includes a bubbler (Bub) 27 for supplying a chemical liquid and a trap (TRAP) 28 for cleaning the exhaust gas. Further, arranged below the bubbler (Bub) 27 are a power supply source (not shown), a chemical liquid chamber,(not shown) for storing a chemical liquid such as HMDS (hexamethyl disilane) and a gas such as an ammonia ($NH_3$) gas, and a drain 29 for discharging the waste liquid of a process liquid used in the SOD system.

Where an interlayer insulating film or the like is formed on a wafer W by using a low-k material requiring a heat treatment under a humidified atmosphere in the SOD system of the construction described above, the wafer W is transferred into the cooling plate unit (CPL) 24 or 26, the coating process unit (SCT) 11 or 12, the humidifying heat treating unit (HAC) 15, the hot plate unit (LHP) 19 or 23 for a low temperature, the baking unit (DLB) 22 and the curing unit (DLC) 20 in the order mentioned so as to apply prescribed treatments to the wafer W.

Figure 6:
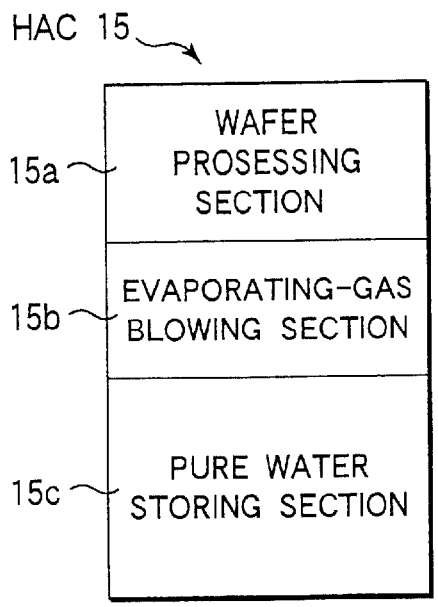
FIG. 6 is a side view schematically showing a humidifying heat treating unit (HAC) according to one embodiment of the present invention.

The construction of the humidifying heating process unit (HAC) will now be described. FIG. 6 is a side view schematically showing the construction of the humidifying heat treating unit (HAC) 15. As shown in the drawing, the humidifying heat treating unit (HAC) 15 includes a pure water storing section 15c for storing a pure water, which is arranged in the lower stage, a wafer processing section 15a for applying a heat treatment to the wafer W under a humidified atmosphere, which is arranged in the upper state, and an evaporating-gas blowing section 15b for evaporating the pure water stored in the pure water storing section 15c so as to mix the evaporated water with a nitrogen gas and for blowing the nitrogen gas (humidified gas) controlled at a prescribed humidity into the wafer processing section 15a, which is arranged in the middle state.

Incidentally, it is possible to blow a nitrogen gas into the evaporating-gas blowing section 15b by utilizing, for example, the piping of a factory. It is also possible to arrange a bomb loaded with a nitrogen gas in the pure water storing section 15c for supplying a required amount of the nitrogen gas from the bomb into the evaporating-gas blowing section 15b. Concerning the pure water supply system, it is possible to supply a pure water from a prescribed storing site into the pure water supply line without arranging the pure water storing section 15c.

Figure 7:
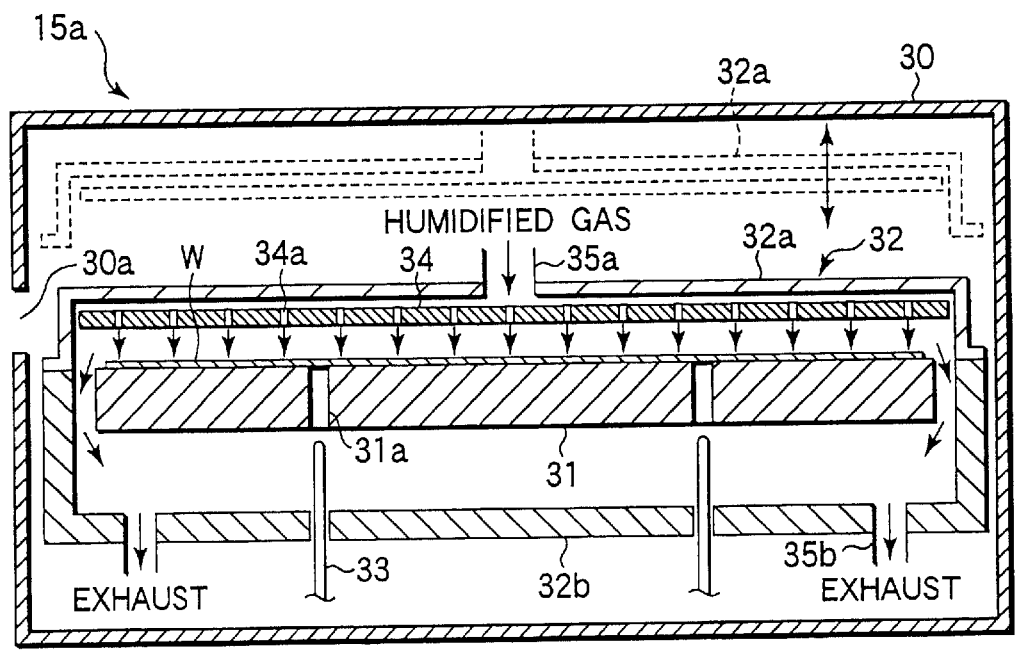
FIG. 7 is a cross sectional view showing the construction of a wafer process section included in the humidifying heat treating unit (HAC) according to one embodiment of the present invention.

FIG. 7 is a cross sectional view schematically showing the construction of the wafer processing section 15a. As shown in the drawing, a housing 30 including an open portion 30a through which the wafer transfer arms 55, 56, 57 can be moved into the open portion 30a and which can be closed by a shutter (not shown) is arranged in the wafer processing section 15a. A hot plate 31 for heating, the wafer W disposed thereon and a chamber 32 housing the hot plate 31 are arranged within the housing 30.

Proximity pins each having a prescribed length (not shown) are arranged on the surface of the hot plate 31. The wafer W is held at the tips of the proximity pins so as to prevent the wafer W from being brought into a direct contact with the surface of the hot plate 31. Further, holes 31a are formed at prescribed positions of the hot plate 31, and lift pins 33 for moving the wafer W up and down are arranged to extend through the holes 31a. The lift pins 33 can be moved in the vertical direction by a lift mechanism (not shown).

The chamber 32 includes a lid 32a arranged movable in the vertical direction and a fixed lower container 32b. A gas supply port 35a, for introducing a humidified gas supplied from the evaporating-gas blowing section 15b into the chamber 32 is formed in the central portion of the lid 32a. Further, a diffusion plate 34 having a plurality of gas spurting ports 34a formed at prescribed positions so as to permit the humidified gas supplied from the gas supply port 35a into the chamber 32 to be supplied substantially uniformly onto the surface of the wafer W is arranged inside the lid 32a and above the wafer W disposed on the hot plate 31.

The blowing pressure of the humidified gas supplied forward to the diffusion plate 34 is high in the central portion and low in the peripheral portion of the diffusion plate 34. Therefore, the gas spurting port 34a formed in the central portion of the diffusion plate 34 is designed to have a small diameter, and the gas spurting port formed in the peripheral portion of the diffusion plate 34 is designed to have a large diameter. Alternatively, the gas spurting ports 34a are formed at a high density in the peripheral portion and at a low density in the central portion of the diffusion plate 34. As a result, a humidified gas can be supplied substantially uniformly over the entire surface of the wafer W, because the humidified gas is spurted through the diffusion plate 34 in uniform pressure.

The gas supplied substantially uniformly from the gas spurting ports 34a onto the wafer W flows through the clearance between the side surface of the lower container 32b and the side surface of the hot plate 31 so as to be discharged to the outside through an exhaust port 35b formed through the bottom wall of the lower container 32b.

The process step for forming an interlayer insulating film using a low-k material on the wafer W by using the humidifying heat treating unit (HAC) of the construction described above is, for example, as follows. In the first step, the wafer W is transferred into any of the coating process units (SCT) 11 and 12 by using any of the wafer transfer arms 55, 56 and 57. In some cases, the wafer W is transferred directly from a carrier (container) housing the wafers W into the coating process unit (SCT) 11 or 12. In other cases, the wafer W is set at a prescribed temperature in the cooling plate unit (CPL) 24 or 26 so as to facilitate a uniform coating of a coating liquid made of a low-k material, followed by transferring the wafer W into the coating process unit (SCT) 11 or 12.

In the coating process units (SCT) 11, 12, the wafer W is spin-coated with a coating liquid. To be more specific, the surface of the wafer W is coated with a prescribed amount of the coating liquid, followed by rotating the wafer W at a prescribed rotating speed so as to spread the coating liquid onto the entire surface of the wafer W. As a result, a coated film is formed on the surface of the wafer W.

The wafer having the coated film formed thereon is transferred by, for example, the wafer transfer arm 55 from the coating process unit (SCT) 11 or 12 to the wafer processing section 15a of the humidifying heat treating unit (HAC) 15. In the wafer processing section 15a, the wafer transfer arm 55 holding the wafer W is moved into the housing 30 through the open portion 30a with the lid 32a moved to the upper position and, then, the lift pins 33 are moved upward so as to transfer the wafer W from the wafer transfer arm 55 onto the lift pins 33. Further, the wafer transfer arm 55 is moved out of the housing 30, followed by closing the open portion 30a.

Further, the lift pins 33 are moved downward so as to transfer the wafer W onto the proximity pins mounted to the hot plate 31. For example, the lid 32a is moved downward while spurting a humidified gas controlled to a prescribed humidity from the gas spurting port 34a of the diffusion plate 34 during the downward movement of the lift pins 33 so as to seal the chamber 32, thereby subjecting the wafer W to a heat treatment under a humidified gaseous atmosphere. By this heat treatment, the molecular structure of the coated film is changed to have a skeletal structure that pores are formed during the subsequent curing treatment.

Incidentally, it is possible to move downward the lid 32a after the wafer W is disposed on the hot plate 31. Further, it is possible to start the supply of the humidified gas into the chamber 32 after the wafer W disposed on the hot plate 31 is heated to reach a prescribed temperature. The hot plate 31 is maintained at a constant temperature, and the exhaust treatment through the exhaust port 35a is started after the open portion 30a is closed.

After completion of the processing in the humidifying heat treating unit (HAC), the wafer W is transferred out of the housing 30 and, then, is further transferred into any of the hot plate units (LHP) 19 and 23 for a low temperature by the procedure opposite to that in the case of transferring the wafer W into the housing 30 for starting the processing. In the hot plate units (LHP) 19, 23, the wafer W is subjected to a heat treatment under, for example, an air atmosphere at a temperature of about 150° C. so as to evaporate partly the solvent, water, etc. contained in the coated film.

The wafer W after completion of the processing for a prescribed time in the hot plate unit (LHP) 19 or 23 for a low temperature is transferred by the wafer transfer mechanism (PRA) 18 into the baking unit (DLB) 22. In the baking unit (DLB) 22, the wafer W is subjected to a heat treatment under, for example, the air atmosphere at about 300° C. so as to remove the solvent, water, etc. that were not evaporated in the previous heat treatment in the hot plate unit (LHP) 19 or 23 for a low temperature.

The wafer W after completion of the processing in the baking unit (DLB) 22 is transferred by the wafer transfer mechanism (PRA) 18 into the curing unit (DLC) 20. In the curing process unit (DLC) 20, the coated film is subjected to a curing treatment under a nitrogen gas atmosphere (atmosphere of a low oxygen concentration) at, for example, 420° C. so as to form a dielectric film. Pores derived from the previous processing in the humidifying heat treating unit (HAC) are formed inside the formed dielectric film so as to form a porous film. The pores thus formed serve to lower the dielectric constant of the dielectric film.

In the curing unit (DLC) 20, a cooling treatment is carried out under a nitrogen gas atmosphere after such a heat treatment is applied to the wafer W. Then, the cooled wafer W is transferred out of the curing unit (DLC) 20 by the wafer transfer mechanism (PRA) 18 so as to be brought back into, for example, the chamber in which the wafer W was housed previously.

Figure 2:
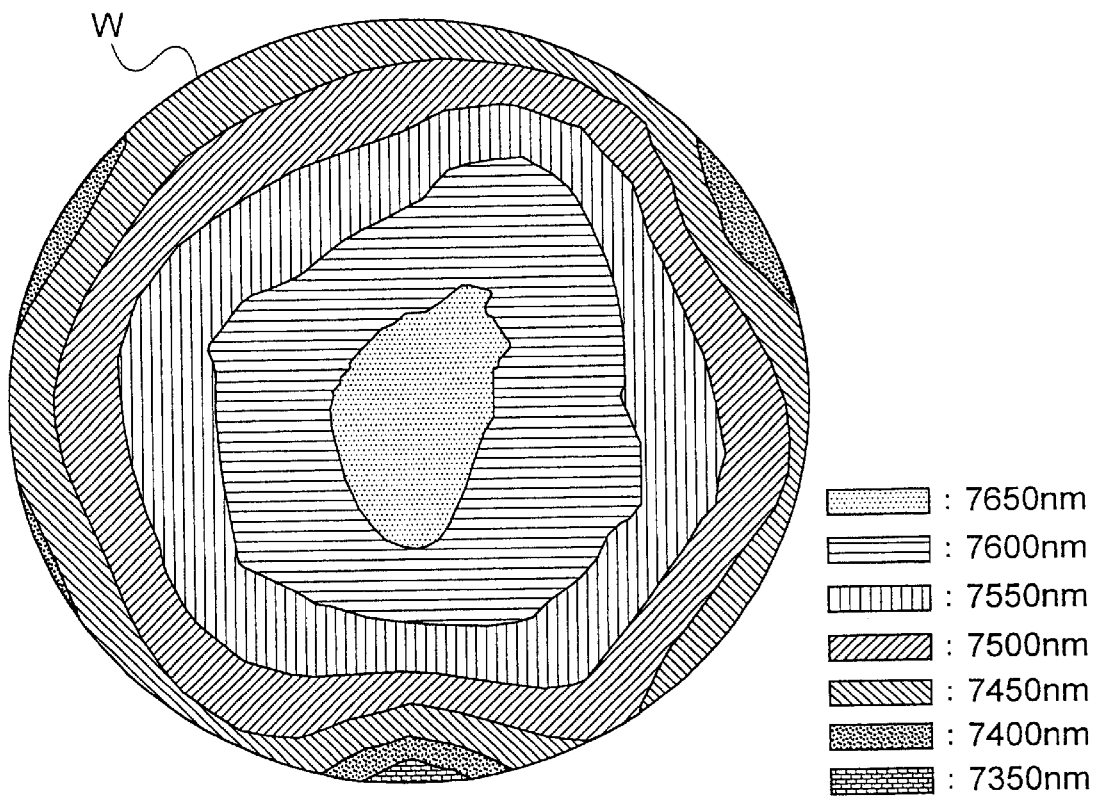
FIG. 2 shows the thickness distribution of a dielectric film formed by using the heat treating unit shown in FIG. 1.
Figure 8:
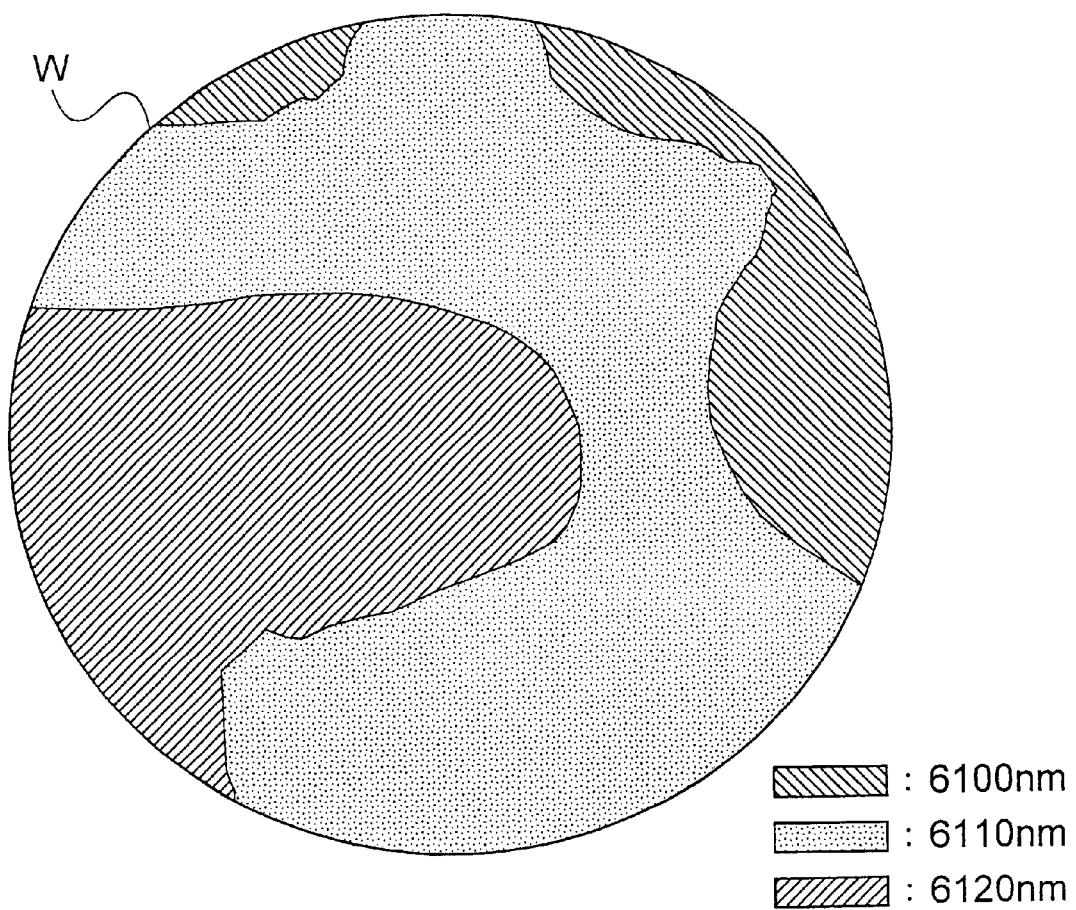
FIG. 8 schematically shows the thickness distribution of an interlayer insulating film formed on a wafer by using a humidifying heat treating unit (HAC)

FIG. 8 exemplifies the thickness distribution of the interlayer insulating film made of a low-k material and formed on the wafer W by the process described above by using the humidifying heat treating unit (HAC) 15. As apparent from the comparison between FIG. 8 and FIG. 2 referred to previously, the difference in the thickness of the interlayer insulating film is small in the case of using the humidifying heat treating unit (HAC) 15.

Figure 1:
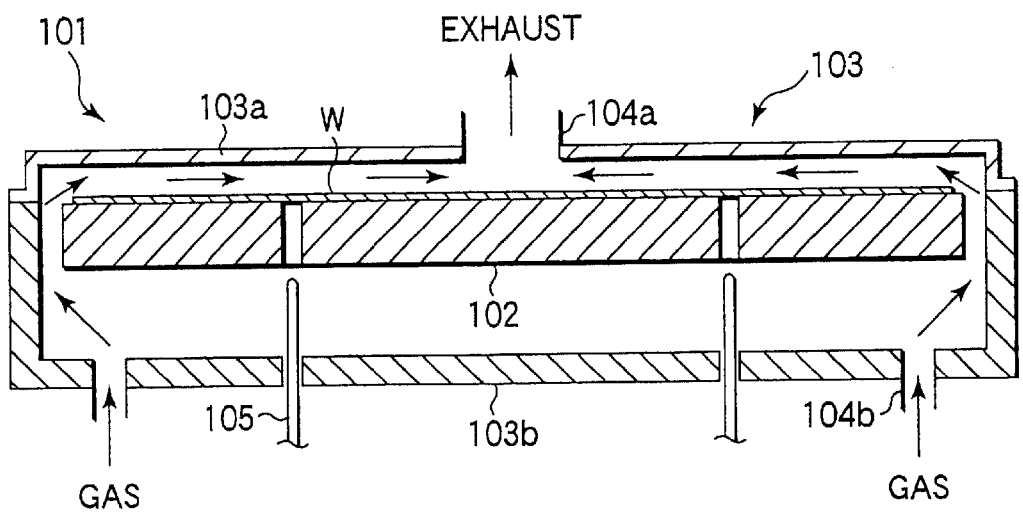
FIG. 1 is a cross sectional view schematically showing the construction of the conventional heat treating unit.

Incidentally, the 3σ value of the thickness distribution shown in FIG. 8 is 0.5%. On the other hand, the 3σ value of the film thickness distribution shown in FIG. 2, which is obtained in the case of using the conventional heat treating unit 101 shown in FIG. 1, is 3.0%. In other words, it has been confirmed that the use of the humidifying heat treating unit (HAC) 15 permits improving the uniformity of the film thickness to a level about 5 times as high as that for the conventional case.

Figure 9:
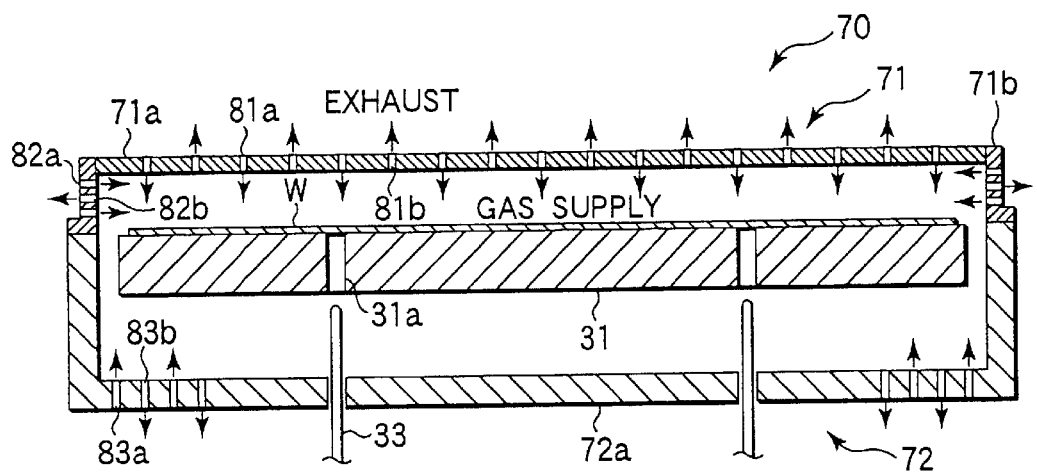
FIG. 9 is a cross sectional view schematically showing the construction of a chamber mounted to a humidifying heat treating unit (HAC) according to another embodiment of the present invention.

It is possible to use a chamber 70 whose cross section is schematically shown in FIG. 9 in place of the chamber 32 in the wafer processing section 15a. The chamber 70 consists of an upper container 71 and a lower container 72. Further, the upper container 71 consists of a lid 71a and a side wall 71b. Incidentally, the upper container 71 is movable in the vertical direction, though FIG. 9 shows the state that a chamber 70 is sealed.

Gas supply ports 81a and exhaust ports 81b are formed in prescribed positions of the lid 71a of the upper container 71. Further, gas supply ports 82a and exhaust ports 82b are formed in prescribed positions of the side wall 71b of the upper container 71. Further, gas supply ports 83a and exhaust ports 83b are formed in prescribed positions of a bottom wall 72a of the lower container 72.

Figure 10:
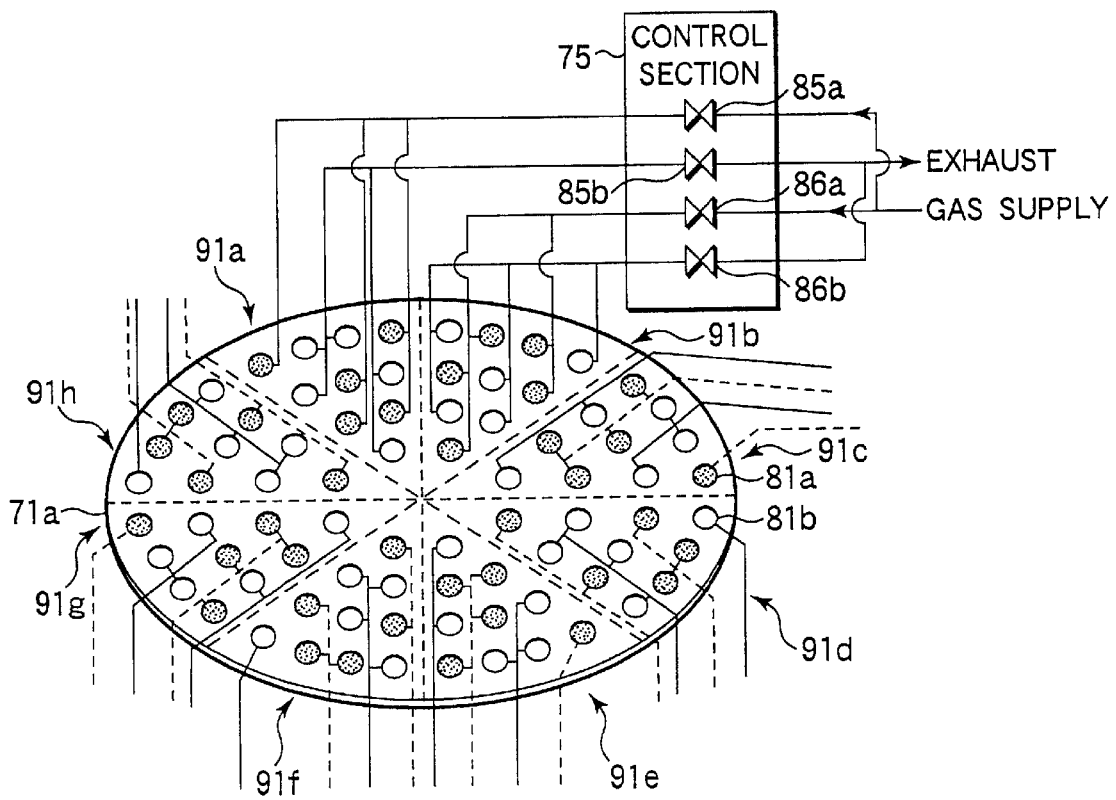
FIG. 10 shows the construction of gas supply ports and exhaust ports formed in the lid of the upper container included in the chamber shown in FIG. 9.

FIG. 10 shows a construction of the gas supply ports 81a and the exhaust ports 81b formed in the lid 71a. Incidentally, in order to distinguish the gas supply ports 81a from the exhaust ports 81b, the gas supply ports 81a are shown shaded in FIG. 10. This is also the case with FIGS. 11 to 14.

As shown in FIG. 10, the lid 71a is divided into eight blocks 91a to 91h, and a plurality of gas supply ports 81a and a plurality of exhaust ports 81b are formed in each of the block,s 91a to 91h. In other words, each of a plurality of gas supply ports 81a and a plurality of exhaust ports 81b formed in the lid 71a is divided into eight blocks 91a to 91h.

The humidified gas supply-exhaust in the chamber 70 is controlled by a control section 75. For example, the gas supply ports 81a formed in the block 91a are connected to an automatic opening-closing valve 85a mounted in the control section 75. It is possible to control the starting-stopping of the gas supply from the gas supply ports 81a included in the block 91a by allowing the automatic opening-closing valve 85a to perform the opening-closing function independently of the other opening-closing valves.

Likewise, the exhaust ports 81b included in the block 91a are connected to an automatic opening-closing valve 85b arranged in the control section 75, and the starting-stopping of the exhaust through the exhaust ports 81b can be controlled by independently controlling the opening-closing of the automatic opening-closing valve 85b.

As shown in FIG. 10, the gas supply ports 81a included in the block 91b are connected to an automatic opening-closing valve 86a and the exhaust ports 81b included in the block 91b are connected to an automatic opening-closing valve 86b. Likewise, the gas supply ports 81a and the exhaust ports 81b included in each of the other blocks 91c to 91h are connected to automatic opening-closing valves mounted in the control section 75 for each of the blocks 91c to 91h, though these automatic opening-closing valves are not shown in FIG. 10. In this fashion, the supply-exhaust of the humidified gas is carried out independently for each of the blocks 91a to 91h in the lid 71a.

Figure 11:
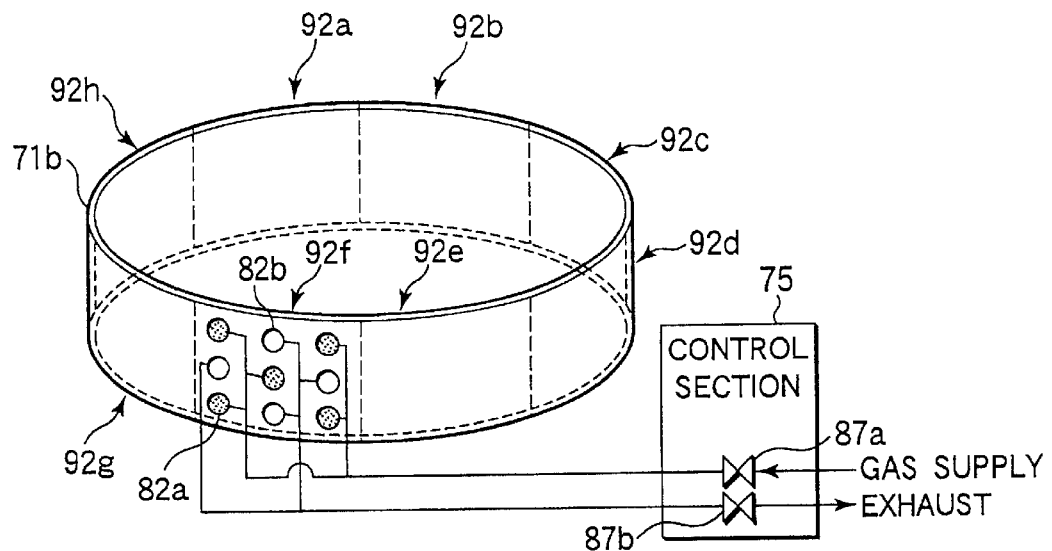
FIG. 11 shows the construction of gas supply ports and exhaust ports formed in the side wall of the upper container included in the chamber shown in FIG. 9.

FIG. 11 show a construction of the gas supply ports 82a and the exhaust ports 82b formed in the side wall 71b. The side wall 71b is divided substantially equidistantly in its circumferential direction into eight blocks 92a to 92h. The gas supply ports 82a included in the block 92f are connected to an automatic opening-closing valve 87a, and the exhaust ports 82b are connected to an automatic opening-closing valve 87b.

FIG. 11 shows the supply-exhaust of the humidified gas in only the block 92f. Needless to say, the supply-exhaust of the humidified gas can be similarly performed in each of the other blocks 92a to 92e, 92g and 92h. It follows that the supply-exhaust of the humidified gas can be performed independently in each of the blocks 92a to 92h in the side wall 71b.

Figure 12:
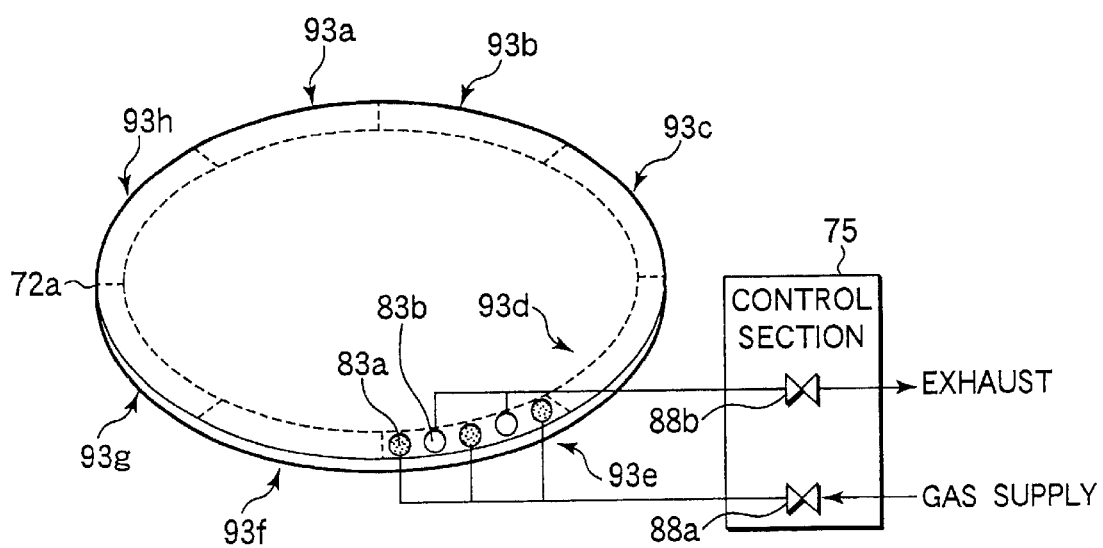
FIG. 12 shows the construction of gas supply ports and exhaust ports formed in the side wall of the lower container included in the chamber shown in FIG. 9.

FIG. 12 shows a construction of the gas supply ports 83a and the exhaust ports 83b formed in the bottom wall 72a of the lower container 72. The peripheral portion in the bottom wall 72a of the lower container 72 is divided into eight blocks 93a to 93h of substantially the same shape. For example, the gas supply ports 83a formed in the block 93e are connected to an automatic opening-closing valve 88a mounted in the control section 75. Likewise, the exhaust ports 83b formed in the block 93e are connected to an automatic opening-closing valve 88b included in the control section 75.

FIG. 12 shows the gas supply ports 83a and the exhaust ports 83b formed in the block 93c alone, and also shows the supply-exhaust of the humidified gas in the block 93e alone. However, the similar supply-exhaust system of the humidified gas is arranged in each of the other blocks 93a to 93d and 93f to 93h. In other words, the supply-exhaust operation of the humidified gas can be performed independently in each of the blocks 93a to 93h in the peripheral portion in the bottom wall 72a of the lower container 72.

In the chamber 70, the supply of a humidified gas into the chamber 70 and the exhaust of the gas from the chamber 70 can be carried out independently in each of the 24 divided blocks 91a to 91h, 92a to 92h and 93a to 93h.

For example, it is possible to process the wafer W such that a humidified gas supplied from the gas supply ports 81a is supplied into the blocks 91b, 91d, 91f, 91h, 92a, 92c, 92e and 92g, that a gas is exhausted from the blocks 91a, 91c, 91e, 91g, 92b, 92d, 92f and 92h, that a gas is exhausted from the blocks 93a, 93c, 93e, and 93g, and that no operation is performed in the blocks 93b, 93d, 93f and 93h.

In this case, it is possible to set the supply rate of the humidified gas and the exhaust rate at values differing from each other depending on the blocks by controlling the opening-closing degrees of the automatic opening-closing valves mounted for each block.

It is possible to determine which block to use for the supply of the humidified gas and which block to use for the exhaust by experimentally confirming, for example, the uniformity of the film thickness. If the process conditions are once determined, it is possible to obtain, for example, a dielectric film excellent in, for example, the uniformity of the film thickness by processing the wafer W under the process conditions once determined. Further, even where the film thickness is partially changed, it is possible to take measures easily for making uniform the film thickness distribution by, for example, supplying a larger amount of the humidified gas to the particular portion or, by contraries, by decreasing the supply rate of the humidified gas to the particular region.

Incidentally, if the chamber 70 is operated such that the supply alone of the humidified gas from the gas supply ports 81a is carried out in the blocks 91a to 91h, that no operation is performed in the blocks 92a to 92h, and that the exhaust alone through the exhaust ports 83b are carried out in the blocks 93a to 93h, the chamber 70 can be used like the chamber 32 as a consequence.

Figure 13:
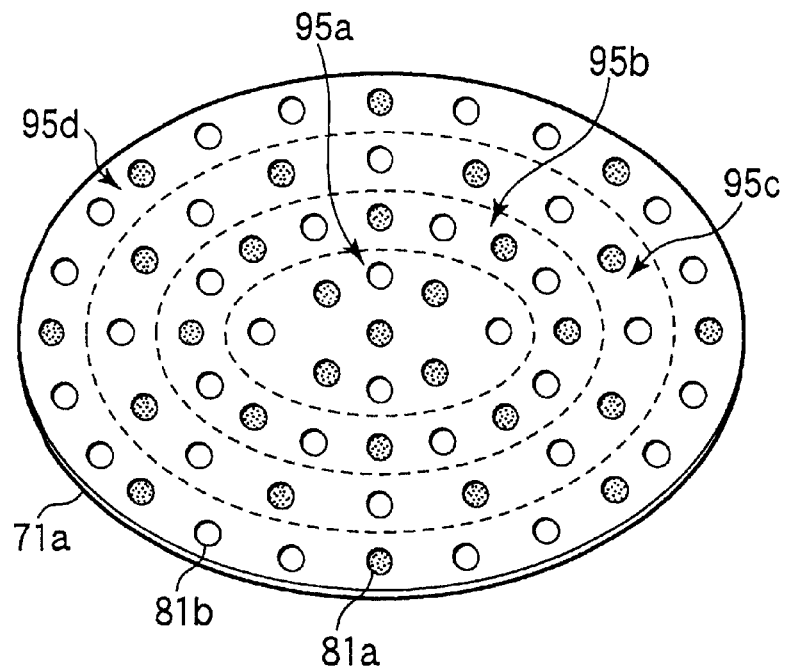
FIG. 13 shows another example of the partition of the block in the lid of the upper container included in the chamber shown in FIG. 9.

The present invention is not limited to the embodiments described above. For example, the partition of the blocks in the chamber 70 is not limited to the embodiments shown in FIGS. 10 to 12. FIG. 13 shows another example of the partition of the blocks in the lid 71a.

In the embodiment shown in FIG. 13, the gas supply ports 81a and the exhaust ports 81b formed in the lid 71 are classified into four concentrically partitioned blocks 95a to 95d, i.e., the circular block 95a in the central portion and the annular blocks 95b, 95c and 95d arranged around the circular block 95a such that the annular block 95b is positioned to surround the circular block 95a, the annular block 95c is positioned to surround the annular block 95b, and the annular block 95d is positioned to surround the annular block 95c. In this case, the supply-exhaust of the humidified gas is controlled independently for each of the blocks 95a to 95d.

In the chamber 70, the number and positions of the gas supply ports and exhaust ports as well as the shape and number of the blocks arranged in the lid 71a are not limited to those shown in FIG. 10 or 13. For example, the shape of the block is not limited to the fan shape shown in FIG. 10 or to the circular or annular shape as shown in FIG. 13. For example, it is possible to classify the gas supply ports and the exhaust ports in a manner to form lattice-shaped blocks.

Figure 14:
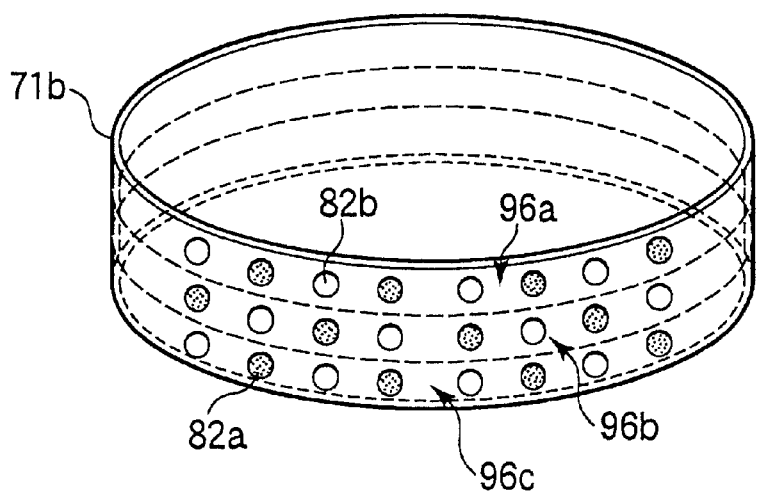
FIG. 14 shows another example of the partition of the block in the side wall of the upper container included in the chamber shown in FIG. 9.

Likewise, where the gas supply ports 82a and the exhaust ports 82b are formed in the side wall 71b in a manner to form three stages in the vertical direction as shown in FIG. 11, it is possible to classify the gas supply ports 82a and the exhaust ports 82b in a manner to form three blocks 92a to 96c of the upper stage, the middle stage and the lower stage as shown in FIG. 14. In this case, the supply-exhaust of the humidified gas can be controlled for each of these blocks 96a to 96c. It is also possible to form lattice-shaped blocks. Incidentally, some of the gas supply ports 82a and the exhaust ports 82b are omitted from the drawing of FIG. 14.

It is possible to carry out simultaneously the supply of the humidified gas from the gas supply ports 81a and the exhaust of the gas through the exhaust ports 81b in a single block, e.g., the block 91a formed in the lid 71a. In this case, it is possible to supply a sufficiently large amount of the humidified gas into the chamber 70 by, for example, making the supply rate of the humidified gas higher than the exhaust rate.

It is also possible to allow the humidity of the humidified gas supplied to the gas supply ports 81a formed in the block 91a to be different from the humidity of the humidified gas supplied to the gas supply ports 81a formed in the block 91b.

Further, it is possible to control independently each of the blocks 91a to 91h by forming the gas supply ports 81a alone in the blocks 91a, 91c, 91e and 91g arranged in the lid 71a and by forming the exhaust ports 81b alone in the blocks 91b, 91d, 91f and 91h arranged in the lid 71a.

Each of the embodiments described above is directed to the case where a water vapor is used as the vapor. However, it is also possible to apply the technical idea of the present invention to an apparatus for processing a substrate by using a gas containing an ammonia gas or a vapor of an organic solvent.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A substrate processing apparatus, comprising:
    holding means for holding a substrate substantially horizontal;
    a chamber for applying a prescribed processing to the substrate held by said holding means;
    a gas supply port formed through the upper wall of said chamber;
    gas supply means for supplying a gas containing a prescribed vapor into said chamber through said gas supply port;
    a diffusion plate arranged above the substrate held by said holding means within said chamber and having a plurality of gas spurting ports arranged at prescribed positions so as to permit the gas supplied into said chamber through said gas supply port to be supplied substantially uniformly onto the surface of said substrate; and
    exhaust means for exhausting the gas supplied into said chamber to the outside through a bottom portion of said chamber.

2. The substrate processing apparatus according to claim 1, wherein an interlayer insulating film is formed on said substrate.

3. The substrate processing apparatus according to claim 2, wherein said gas supply means supplies an inert gas containing a water vapor into said chamber.

4. The substrate processing apparatus according to claim 1, wherein said holding means consists of a hot plate capable of heating said substrate to a prescribed temperature.

5. The substrate processing apparatus according to claim 1, wherein the diameter of said gas spurting port formed in the central portion of said diffusion plate is smaller than the diameter of said gas spurting port formed in the peripheral portion of said diffusion plate.

6. The substrate processing apparatus according to claim 1, wherein the density of said gas spurting ports formed in the central portion of said diffusion plate is lower than the density of said gas spurting ports formed in the peripheral portion of said diffusion plate.

7. A substrate processing apparatus, comprising:
holding means for holding a substrate substantially horizontal;
a chamber for applying a prescribed processing to the substrate held by said holding means and having a plurality of blocks;
a gas supply port and a gas exhaust port arranged in said chamber for every block;
gas supply means for supplying a gas containing a prescribed vapor into said chamber through said gas supply port;
gas exhausting means for exhausting said chamber through said gas exhaust port; and
a gas supply-exhaust control mechanism for optionally controlling for every block the gas supply into said chamber through said gas supply port and the exhaust of said chamber through said gas exhaust port.

8. The substrate processing apparatus according to claim 7, wherein an interlayer insulating film is formed on said substrate.

9. The substrate processing apparatus according to claim 8, wherein said gas supply means supplies an inert gas containing a water vapor into said chamber.

10. The substrate processing apparatus according to claim 7, wherein a plurality of said gas supply ports and a plurality of said gas exhaust ports are formed for every block in said chamber.

11. The substrate processing apparatus according to claim 7, wherein said chamber includes a lid covering a region above the substrate held by said holding means, and said plural blocks are provided in said lid.

12. The substrate processing apparatus according to claim 11, wherein said plural blocks of said lid are shaped annularly.

13. The substrate processing apparatus according to claim 11, wherein said plural blocks of said lid are shaped radially.

14. The substrate processing apparatus according to claim 7, wherein said chamber includes a side wall surrounding the outer circumference of the substrate held by said holding means, and said plural blocks are provided in said side wall.

15. The substrate processing apparatus according to claim 14, wherein said plural blocks of said side wall are shaped equidistantly in the circumferential direction.

16. The substrate processing apparatus according to claim 14, wherein said plural blocks of said side wall are shaped in a manner to be stacked one upon the other in the vertical direction.

17. The substrate processing apparatus according to claim 7, wherein said chamber includes a bottom wall arranged below said holding means, and said plural blocks are provided in said bottom wall.

18. The substrate processing apparatus according to claim 17, wherein said plural blocks of said bottom wall are shaped annularly.

19. The substrate processing apparatus according to claim 11, wherein said plural blocks of said bottom wall are shaped radially.

20. The substrate processing apparatus according to claim 7, wherein said gas supply port and/or said gas exhaust port are formed in a plurality of points for every block.

21. The substrate processing apparatus according to claim 7, wherein said holding means consists of a hot plate capable of heating said substrate.

* * * * *